(12) United States Patent
Takeishi

(10) Patent No.: US 6,376,048 B1
(45) Date of Patent: Apr. 23, 2002

(54) LAMINATION STRUCTURE, WIRING STRUCTURE, MANUFACTURE THEREOF, AND SEMICONDUCTOR DEVICE

(75) Inventor: Shunsaku Takeishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/227,527

(22) Filed: Jan. 8, 1999

(30) Foreign Application Priority Data

Jun. 26, 1998 (JP) ............................................ 10-180918

(51) Int. Cl.[7] ............................. B32B 9/04; B32B 13/12
(52) U.S. Cl. ........................ 428/209; 428/446; 428/447; 428/448; 428/450; 428/696
(58) Field of Search ................................. 428/446, 451, 428/343, 344, 696, 447, 448, 450, 209

(56) References Cited

U.S. PATENT DOCUMENTS 6,037,274 A * 3/2000 Kudo et al. .................. 438/778
6,071,830 A * 6/2000 Matsuzawa et al. ........ 438/778

FOREIGN PATENT DOCUMENTS

| JP | 4-329638 | 11/1992 |
|---|---|---|
| JP | 9-232303 | 9/1997 |
| JP | 410284476 A | * 10/1998 |

* cited by examiner

Primary Examiner—Deborah Jones
Assistant Examiner—Stephen Stein
(74) Attorney, Agent, or Firm—Armstrong, Westerman, Hattori, McLeland & Naughton, LLP

(57) ABSTRACT

A first layer is disposed on the principal surface of a substrate. An adhesive layer made of Si containing fluorocarbon is disposed on the first layer. A second layer is disposed on the adhesive layer. One of the first and second layers is made of a material selected from a group consisting of a material whose main component is Si containing inorganic material, a metal, and an inorganic metal compound, and the other is made of an organic insulating film. Tight contactness of the organic layer to the layer whose main component is inorganic material can be improved.

10 Claims, 6 Drawing Sheets

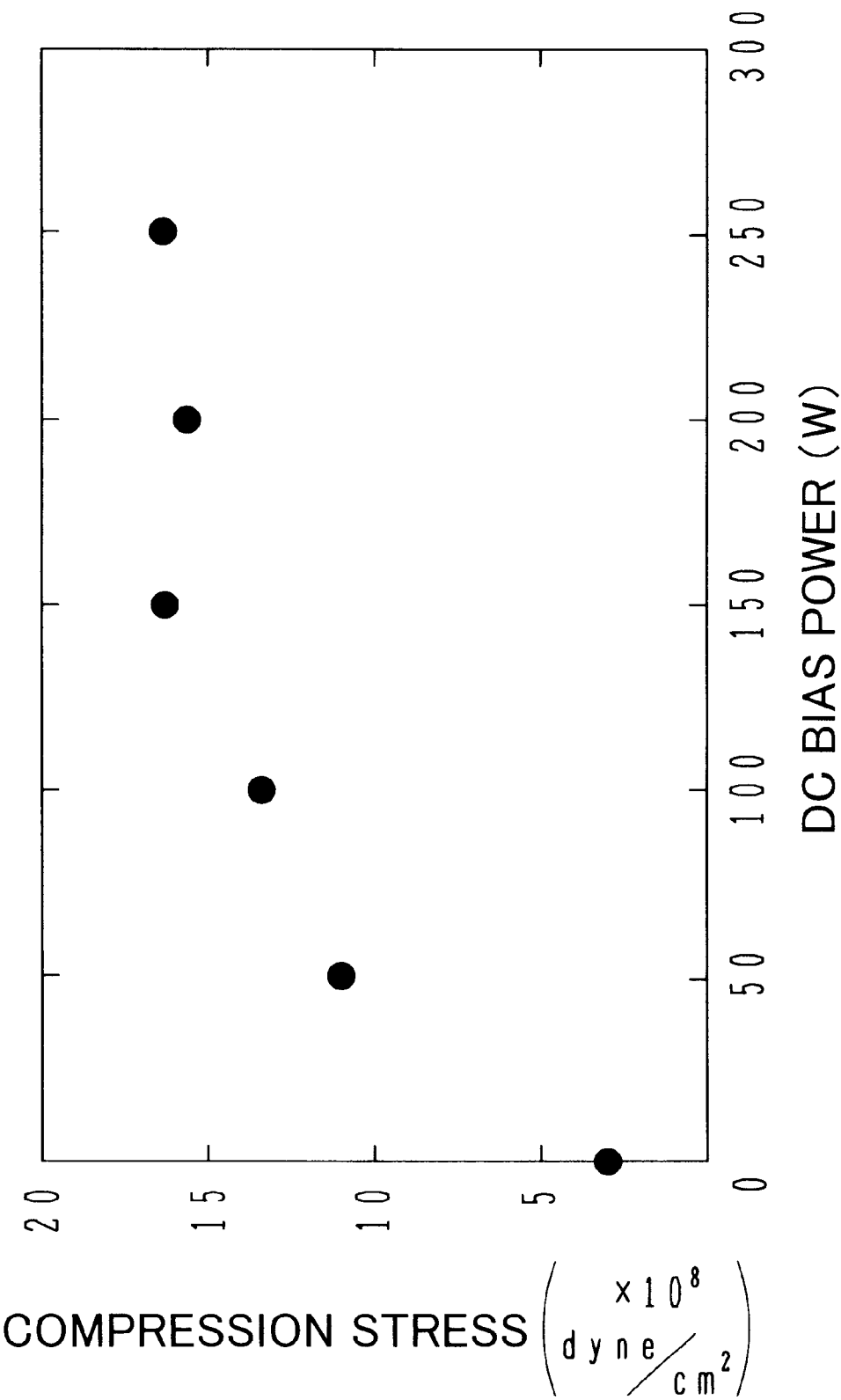

LAMINATION STRUCTURE, WIRING STRUCTURE, MANUFACTURE THEREOF, AND SEMICONDUCTOR DEVICE

This application is based on Japanese Patent Application No. 10-180918 filed on Jun. 26, 1998, the entire contents of which are incorporated herein by reference.

BACKGROUND OF THE INVENTION a) Field of the Invention

The present invention relates to a lamination structure, a wiring structure, and a manufacture thereof, and more particularly a lamination structure having a layer whose main components are inorganic material and an organic material layer stacked upon the inorganic material layer, a wiring structure, and a manufacture thereof b) Description of the Related Art Reconsidering insulating materials of a multi-layer wiring structure has been scrutinized recently from the viewpoint of high integration and high speed of semiconductor devices. $SiO_2$ is generally used as the insulating material of semiconductor devices. A dielectric constant of $SiO_2$ is about 4.1 at 1 MHz. Insulating materials having a smaller dielectric constant have been desired in order to shorten a transmission delay time of a signal which transmits through a multi layer wiring structure.

Low dielectric constant materials such as SiOF have been paid much attention as alternative materials to $SiO_2$. A dielectric constant of SiOF is about 3.0 at 1 MHz lower than that of $SiO_2$. However, heat-resisting properties of these low dielectric constant films such as SiOF are inferior to those of an $SiO_2$ film.

Organic insulating films have also been paid attention as low dielectric constant materials excepting SiOF.

Tight contactness of an organic insulating film is not good relative to an inorganic insulating film, a metal film, and the like which are commonly used in a semiconductor device.

SUMMARY OF THE INVENTION

It is an object of the present invention to provide a lamination structure, a wiring structure, and a manufacture method capable of improving tight contactness between a layer whose main components are inorganic materials and an organic material.

According to one aspect of the present invention, there is provided a lamination structure comprising: a substrate having a principal surface; a first layer disposed on the principal surface; an adhesive layer disposed on the first layer, the adhesive layer being made of Si containing fluorocarbon; and a second layer disposed on the adhesive layer, wherein one of the first and second layers is made of a material selected from a group consisting of a material whose main component is Si containing inorganic material, a metal, and an inorganic metal compound, and another is made of an organic insulating film.

Tight contactness of the second layer to the underlying layer surface can be improved by inserting the adhesive layer between the first and second layers.

According to another aspect of the present invention, there is provided a wiring structure comprising: a substrate having a principal surface and a conductive region formed in a partial area of the principal surface; a first interlayer insulating film formed on the substrate; a first adhesive layer formed on the first interlayer insulating film, the first adhesive layer being made of Si containing fluorocarbon; a contact hole formed through the first adhesive layer and the first interlayer insulating film, the contact hole having as a bottom at least a partial area of the conductive region; a second interlayer insulating film formed on the first adhesive layer, the second interlayer insulating film being made of organic insulating material; a wiring trench formed through the second interlayer insulating film and partially overlapping the contact hole; and a wiring pattern completely burying the contact hole and the wiring trench and connected to the conductive region.

Tight contactness of the second interlayer insulating film to the underlying layer surface can be improved by disposing the first adhesive layer under the second interlayer insulating film. The second interlayer insulating film in which the wiring pattern is embedded is made of organic insulating material. If the organic insulating material having a low dielectric constant is used, the parasitic capacitance between lines of the wiring pattern can be made small and a signal transmission delay time can be shortened.

According to another aspect of the present invention, there is provided a method of forming a wiring structure comprising the steps of: preparing a substrate having a principal surface and a conductive region formed in a partial area of the principal surface; forming a first interlayer insulating film on the substrate; forming a first adhesive layer on the first interlayer insulating film, the first adhesive layer being made of Si containing fluorocarbon; forming an opening through the first adhesive layer in an area corresponding to the conductive region; etching the first interlayer insulating film to form a contact hole corresponding to the opening, by using the first adhesive layer as an etching mask; burying the contact hole with conductive material to form a conductive plug connected to the conductive region; forming a second interlayer insulating film on the first adhesive layer, the second interlayer insulating film being made of organic insulating material; and forming a wiring trench through the second interlayer insulating film and burying the wiring trench with conductive material to form a wiring pattern.

Tight contactness of the second interlayer insulating film to the underlying layer surface can be improved by disposing the first adhesive layer under the second interlayer insulating film. The second interlayer insulating film in which the wiring pattern is embedded is made of organic insulating material. If the organic insulating material having a low dielectric constant is used, the parasitic capacitance between lines of the wiring pattern can be made small and a signal transmission delay time can be shortened.

BRIEF DESCRIPTION OF THE DRAWINGS

FIG. 3 is a graph showing a relation between a DC bias power supplied to a substrate and a compression stress of an Si containing fluorocarbon film while the film is grown through PE-CVD.

DETAILED DESCRIPTION OF THE PREFERRED EMBODIMENTS

Figure 1A:
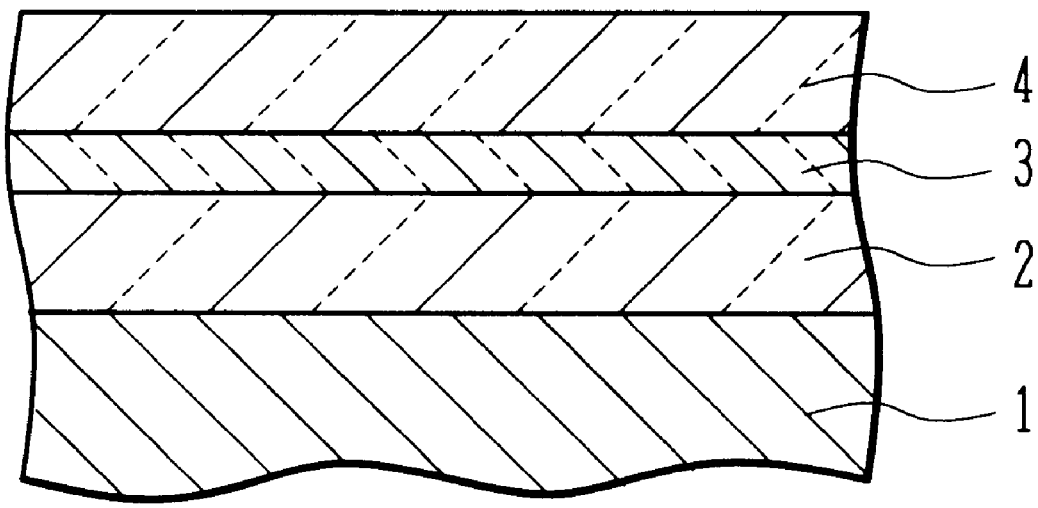
FIGS. 1A and 1B are cross sectional views of wiring structures according to a first embodiment of the invention.

FIG. 1A is a cross sectional view of a lamination structure according to the first embodiment of the invention. An inorganic insulating film 2, an adhesive layer 3, and an organic insulating film 4 laminated in this order from the bottom are on the surface of a silicon substrate 1.

As the materials of the inorganic material insulating film 2, silicon oxide ($SiO_2$), silicon nitride (SiN), silicon oxynitride (SiON), fluorine doped silicon oxide (SiOF), boron doped silicon oxide (SiOB) boron doped silicon nitride (SiNB), phosphosilicate glass (PSG: phosphorous doped silicon oxide), borophosphosilicate glass (BPSG: boron and phosphine doped silicon oxide), hydrosilsesquioxane (HSQ), and organic spin-on-glass (HSG) were used. In this specification, although HSG contains Si containing inorganic material as its main component and also contains inorganic components, HSG is intended to be included in the inorganic insulating material.

The adhesive layer 3 was made of Si containing fluorocarbon (SiCF). The adhesive layer 3 was formed through plasma enhanced chemical vapor deposition (PE-CVD) by using $C_2H_2$, $C_4F_8$, and $SiH_4$ as source gases. The adhesive layer 3 were grown under the conditions of a $C_2H_2$ flow rate of 8.6 sccm, a $C_4F_8$ flow rate of 60 sccm, an $SiH_4$ flow rate of 20 sccm, a substrate temperature of 200 to 400° C., a pressure of 0.3 to 5.0 Torr, a plasma generating electromagnetic field radio frequency of 13.56 MHz, and a power of 50 W.

As the materials of the organic insulating film, fluorocarbon (CF), fluorinated benzocyclobutene (PFCB manufactured by Dow Chemical Company), benzocyclobutene (BCB manufactured by Dow Chemical Company), fluorinated polyaryl ether (FLARE1.0 manufactured by Allied Signal Inc.), polyaryl ether (FLARE2.0 manufactured by Allied Signal Inc. or PAE manufactured by Schumacher Co.), parylene, polyimide, and fluorinated polyimide were used.

Tight contactness of the organic insulating film 4 of the lamination structure shown in FIG. 1A was evaluated by Sebastian tests. A flat end of a test rod like a nail was bonded to the surface of the organic insulating film 4 of the lamination structure shown in FIG. 1A with epoxy based adhesive. The test rod was pulled upward to observe at what tension the organic insulating film was peeled off. The tension when the interface between the organic insulating film 4 and test rod was peeled off was about 600 kgw/cm$^2$.

The thicknesses of the inorganic insulating film 2, adhesive layer 3, and organic insulating film 4 were 0.1 to 2.0 $\mu$m, 0.01 $\mu$m, and 0.05 to 2.0 $\mu$m, respectively.

The methods of forming the inorganic insulating film 2 and organic insulating film 4 used for evaluating samples will be described.

The inorganic insulating films 2 were formed through PE-CVD under the conditions of a substrate temperature of 350° C. and a pressure of 1.0 Torr, by using the materials of $SiO_2$, SiN, SiON, SiOF, SiOB, SiNB, PSG, and BPSG.

$SiH_4$ and $N_2O$ were used as the source gases of $SiO_2$ under the conditions of an $SiH_4$ flow rate of 5 sccm, an $N_2O$ flow rate of 300 sccm, a plasma generating electromagnetic field radio frequency of 200 kHz, and a supply power of 30 W. $SiH_4$ and $NH_3$ were used as the source gases of SiN under the conditions of an $SiH_4$ flow rate of 10 sccm, an $HN_3$ flow rate of 300 sccm, a plasma generating electromagnetic field radio frequency of 200 kHz, and a supply power of 30 W.

$SiH_4$, $N_2O$, and $NH_3$ were used as the source gases of SiON under the conditions of an $SiH_4$ flow rate of 10 sccm, an $N_2O$ flow rate of 300 sccm, an $NH_3$ flow rate of 300 sccm, a plasma generating electromagnetic field radio frequency of 200 kHz, and a supply power of 30 W. TEOS (He), $O_2$, and $C_2F_6$ were used as the source gases of $SiO_2$ under the conditions of an TEOS flow rate of 480 sccm, an $O_2$ flow rate of 700 sccm, a $C_2F_6$ flow rate of 350 sccm, plasma generating electromagnetic field radio frequencies of 13.56 MHz and 350 kHz, and supply powers of 80 W and 90 W, respectively.

$SiH_4$, $N_2O$, $B_2H_6$, and $N_2$ were used as the source gases of SiOB under the conditions of an $SiH_4$ flow rate of 5 sccm, an $N_2O$ flow rate of 300 sccm, a $B_2H_6$ flow rate of 5 sccm, an $N_2$ flow rate of 95 sccm, a plasma generating electromagnetic field radio frequency of 200 kHz, and a supply power of 30. $SiH_4$, $NH_3$, $B_2H_6$, and $N_2$ were used as the source gases of SiNB under the conditions of an $SiH_4$ flow rate of 10 sccm, an $NH_3$ flow rate of 300 sccm, a $B_2H_6$ flow rate of 5 sccm, an $N_2$ flow rate of 95 sccm, a plasma generating electromagnetic field radio frequency of 200 kHz, and a supply power of 30 W.

$SiH_4$, $N_2O$, $PH_3$, and $N_2$ were used as the source gases of PSG under the conditions of an $SiH_4$ flow rate of 5 sccm, an $N_2O$ flow rate of 300 sccm, a $PH_3$ flow rate of 1 sccm, an $N_2$ flow rate of 99 sccm, a plasma generating electromagnetic field radio frequency of 200 kHz, and a supply power of 30 W. $SiH_4$, $N_2O$, $PH_3$, $B_2H_6$, and $N_2$ were used as the source gases of BPSG under the conditions of an $SiH_4$ flow rate of 5 sccm, an $N_2O$ flow rate of 300 sccm, a $PH_3$ flow rate of 1 sccm, a $B_2H_6$ flow rate of 0.5 sccm, an $N_2$ flow rate of 148.5 sccm, a plasma generating electromagnetic field radio frequency of 200 kHz, and a supply power of 30 W.

The inorganic insulating film 2 of HSQ was formed by spin coating.

The inorganic insulating film 2 of HSG was formed by spin coating. The spinning conditions were 500 rpm during first 8 seconds and 4000 rpm during 30 seconds thereafter. The baking conditions were 150° C. during first 30 seconds and 250° C. during 30 seconds thereafter. The curing conditions were 450° C. for 60 minutes.

The organic insulating film 4 of CF was formed through PE-CVD. $C_2H_2$ and $C_4F_8$ were used as the source gases of CF under the conditions of a $C_2H_2$ flow rate of 8.6 sccm, a $C_4F_8$ flow rate of 60 sccm, a substrate temperature of 200 to 400° C., a pressure of 0.3 to 1.2 Torr, an electromagnetic field radio frequency of 13.56 MHz, and a supply power of 50 to 400 W.

The organic insulating films 4 of PFCB, BCB, FLARE1.0, FLARE2.0, polyimide, and PAE were formed by spin coating. Cyclohexane was used as solvent for all these materials.

The spinning conditions for the organic insulating film 4 of PFCB were 300 rpm during first 5 seconds and 3000 rpm during 30 seconds thereafter. The baking conditions were 100° C. for 45 seconds. The curing conditions were 120° C. during first 60 minutes and 300° C. during 60 minutes thereafter.

The spinning conditions for the organic insulating film 4 of BCB were 300 rpm during first 5 seconds and 3000 rpm during 30 seconds thereafter. The baking conditions were 100° C. for 45 seconds. The curing conditions were 150° C. during first 60 minutes and 250° C. during 60 minutes thereafter.

The spinning conditions for the organic insulating film 4 of FLARE were 500 rpm during first 5 seconds, 0 rpm during five seconds thereafter, and 2000 rpm during 60 seconds thereafter. The baking conditions were 150° C. during first one minute, 200° C. during one minute thereafter, and 250° C. during one minute thereafter. The curing conditions were 425° C. for 60 minutes.

The spinning conditions for the organic insulating film 4 of polyimide were 500 rpm during first 8 seconds and 3400 rpm during 30 seconds thereafter. The baking conditions were 110° C. during first 30 seconds and 140° C. during 30 seconds thereafter. The curing conditions were 350° C. for 60 minutes.

The spinning conditions for the organic insulating film 4 of PAE were 300 rpm during first 5 seconds and 2000 rpm during 60 seconds thereafter. The baking conditions were 60° C. during first one minute and 275° C. during one minute thereafter. The curing conditions were 425° C. for 60 minutes.

The organic insulating film 4 of parylene was formed through vapor phase growth.

The organic insulating film 4 of fluorinated polyimide was formed through spin coating and the film forming conditions were the same as the conditions of forming a polyimide film.

No peel-off of the organic insulating film 4 was found by Sebastian tests in all combinations of materials of the inorganic insulating film 2 and organic insulating film 4. For comparison, samples without the adhesive layer 3 of the lamination structure shown in FIG. 1A were tested in a similar manner, Samples with an adhesive layer of amorphous carbon which was expected to have high contactness to an organic insulating film were also tested in a similar manner. When the adhesive layer 3 was not inserted, a peel-off of the organic insulating film 4 was found in the whole or partial flat end areas of test rods. When the adhesive layer 3 of amorphous carbon was used, a peel-off of the organic insulating film 4 was found in partial flat end areas of test rods.

If the adhesive layer of SiCF is inserted between the inorganic insulating film 2 and organic insulating film 4, tight contactness therebetween can be improved. The reason for this may be ascribed in the following.

Since carbon atoms contained in the organic insulating film 4 are easy to couple with carbon atoms contained in the adhesive layer 3, tight contactness therebetween becomes high. Since silicon atoms contained in the inorganic insulating film 2 are easy to couple with silicon atoms contained in the adhesive layer 3, tight contactness therebetween becomes high. The reason of high tight contactness of the organic insulating film 4 to the substrate may be ascribed in this. If the density distribution of Si in the adhesive layer is made to take a lower density toward the organic insulating film 4 along its depth direction, higher tight contactness can be expected.

Similar effects described above may be expected by using, as the materials of the inorganic insulating film 2, Si containing inorganic material or material whose main components are Si containing inorganic material, different from the above-described insulating materials. Similar effects described above may also be expected by using, as the materials of the organic insulating film 4, other organic materials different from those described above.

Prior to forming the adhesive layer 3 of the lamination structure shown in FIG. 1A, a thin surface layer of the inorganic insulating film 2 may be sputtered with Ar. With Ar sputtering, the surface of the underlying layer of the adhesive layer 3 can be cleaned so that tight contactness can be improved more.

Next, a modification of the first embodiment will be described. In the first embodiment, the SiCF film is inserted between the inorganic insulating film and organic insulating film to improve contactness therebetween. It can be expected that contactness can be improved even if an inorganic conductive film is used in place of the inorganic insulating film. In this modification, an organic insulating film is formed over a metal film or an inorganic metal compound film.

Figure 1B:
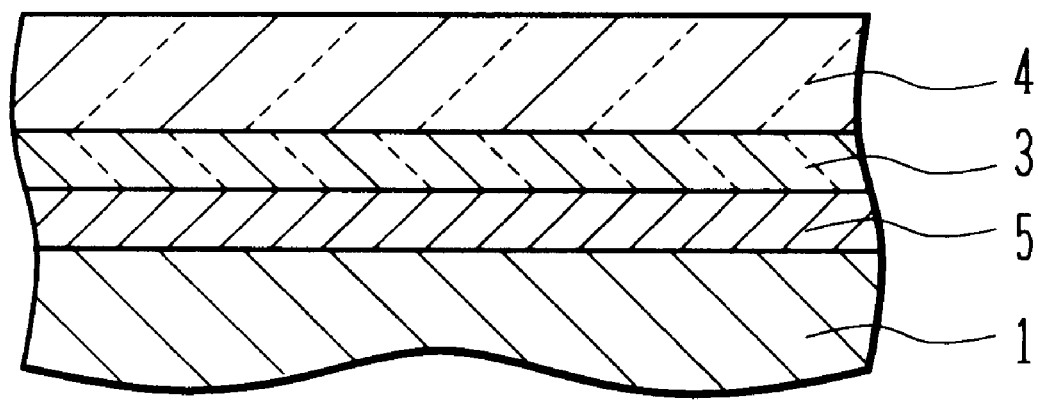

FIG. 1B is a cross sectional view of a lamination structure according to the modification of the first embodiment. A conductive film 5, an adhesive layer 3, and an organic insulating film 4 laminated in this order from the bottom are on the surface of a silicon substrate 1. The materials and film forming methods of the adhesive layer 3 and organic insulating film 4 are the same as the first embodiment shown in FIG. 1A.

As the material of the conductive film 5, aluminum (Al), aluminum silicon (AlSi), copper containing aluminum silicon (AlSiCu), copper containing aluminum (AlCu), tungsten (W), tantalum (Ta), tungsten nitride (WN), tantalum nitride (TaN), copper (Cu), titanium (Ti), or titanium nitride (TiN) was used. The conductive films 5 of these materials were all formed by DC sputtering. The nitride film was formed by reactive sputtering using Ar and $N_2$ as sputtering gases.

The conductive film 5 of Al, AlSi, AlSiCu, or AlCu was formed under the conditions of an Ar gas flow rate of 100 sccm, a substrate temperature of 300° C., a pressure of 3 mTorr, and a DC supply power of 10 kW. The AlSi target was Al:Si=99:1, the AlSiCu target was Al:Si:Cu=98.5:1:0.5, and the AlCu target was Al:Cu=99:1.

The conductive film 5 of W was formed under the conditions of an Ar gas flow rate of 100 sccm, a substrate temperature of 150° C., a pressure of 4 mTorr, and a DC supply power of 5 kW. The conductive film 5 of Ta was formed under the conditions of an Ar gas flow rate of 100 sccm, a substrate temperature of 150° C., a pressure of 4 mTorr, and a DC supply power of 6 kW.

The conductive film 5 of WN was formed under the conditions of an Ar gas flow rate of 50 sccm, an $N_2$ gas flow rate of 50 sccm, a substrate temperature of 150° C., a pressure of 4 mTorr, and a DC supply power of 5 kW. The conductive film 5 of TaN was formed under the conditions of an Ar gas flow rate of 45 sccm, an $N_2$ gas flow rate of 55 sccm, a substrate temperature of 150° C., a pressure of 4 mTorr, and a DC supply power of 6 kW.

The conductive film 5 of Cu was formed under the conditions of an Ar gas flow rate of 25 sccm, a substrate temperature of a room temperature, a pressure of 1.5 Torr, and a DC supply power of 5 kW. The conductive film 5 of Ti was formed under the conditions of an Ar gas flow rate of 25 sccm, a substrate temperature of a room temperature, a pressure of 3 mTorr, and a DC supply power of 5 kW. The conductive film 5 of TiN was formed under the conditions of an Ar gas flow rate of 25 sccm, an $N_2$ gas flow rate of 35 sccm, a substrate temperature of a room temperature, a pressure of 3 mTorr, and a DC supply power of 5 kW.

Also in this modification, tight contactness was evaluated in a manner similar to the first embodiment shown in FIG. 1A. No peel-off of the organic insulating film 4 was found in all combinations of materials of the conductive film 5 and organic insulating film 4. When the adhesive layer 3 was not inserted, a peel-off of the organic insulating film 4 was found in the whole or partial flat end areas of test rods. When the adhesive layer 3 of amorphous carbon was used, a peel-off of the organic insulating film 4 was found in partial flat end areas of test rods.

If the adhesive layer of SiCF is inserted between the conductive film 5 and organic insulating film 4, tight contactness therebetween can be improved.

Similar effects described above may be expected by using, as the materials of the conductive film 5, other metal or metal compounds different from those described above. Similar effects described above may also be expected by using, as the materials of the organic insulating film 4, other organic materials different from those described above.

Figure 2:
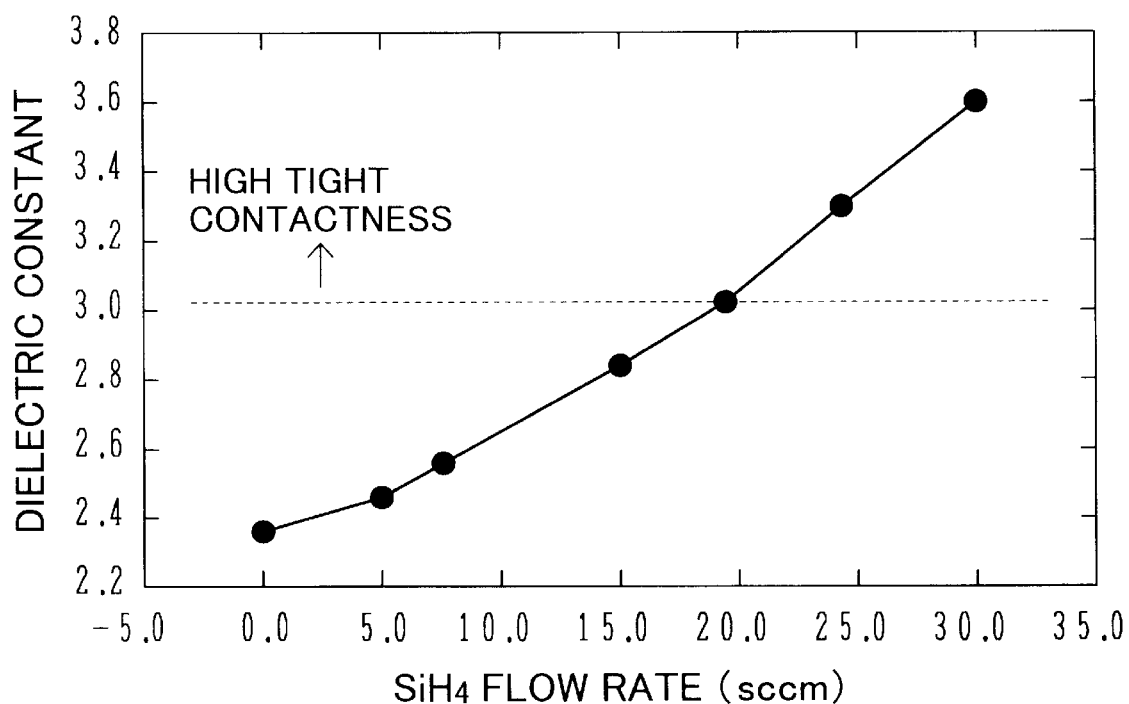
FIG. 2 is a graph showing a relation between an $SiH_4$ flow rate and a dielectric constant while an Si containing fluorocarbon film is grown through PE-CVD.

FIG. 2 shows a relation between an $SiH_4$ flow rate and a dielectric constant of an SiCF film while the film is formed. The abscissa represents the $SiH_4$ flow rate in the unit of sccm, and the ordinate represents a dielectric constant. As the source gases, $SiH_4$, $C_4F_8$, and $C_2H_2$ were used, a $C_4F_8$ flow rate was set to 60 sccm, and a $C_2H_2$ flow rate was set to 8.6 sccm. An electromagnetic field radio frequency was set to 13.56 MHz, its supply power was set to 150 W, a pressure was set to 1.2 Torr, and a substrate temperature was set to 400° C.

As seen from the graph, as the $SiH_4$ flow rate is increased, the dielectric constant increases. At the dielectric constant of the SiCF film of 2.8 or lower, a peel-off of the organic insulating film on the SiCF film was found under a heat treatment at 400° C. after the film formation. At the dielectric constant of the SiCF film of 3.0 or higher, no peel-off was found. It can be said from this that the adhesive layer of SiCF has preferably a dielectric constant of 3.0 or higher.

FIG. 3 is a graph showing a relation between a DC bias power supplied to a substrate and a compression stress in an SiCF film while the film is formed. The abscissa represents a DC bias power in the unit of W, and the ordinate represents a compression stress in the unit of dyne/cm². The compression stress was measured with a stress meter which detects a warp of a wafer from light reflection.

As the DC bias power is changed, the compression stress in the SiCF film also changes. It is therefore possible to control the compression stress in the SiCF film by changing the DC bias power. In forming the lamination structures shown in FIGS. 1A and 1B, the stress in the adhesive layer 3 can be controlled by changing the DC bias voltage when the adhesive layer 3 is formed, by taking into account the stresses of the films on the adhesive layer 3.

Next, with reference to FIGS. 4A to 4C and FIGS. 5A to 5C, the second embodiment will be described. In the second embodiment, the lamination structure of the first embodiment is applied to a multilayer wiring of a semiconductor device formed by a Damascene method.

Figure 4A:
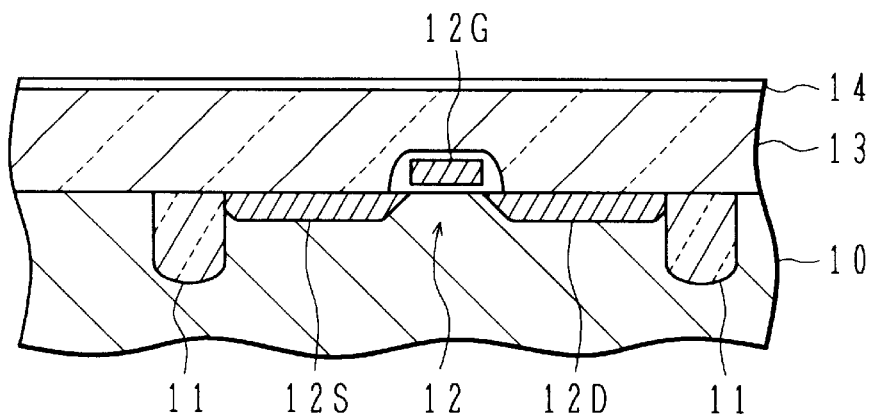
FIGS. 4A to 4C and FIGS. 5A to 5C are cross sectional views of a wiring structure illustrating a method of forming a wiring structure according to a second embodiment of the invention.

As shown in FIG. 4A, formed in a surface layer of a silicon substrate 10 are element separation structures which define active regions. An active region has a MOSFET 12 formed therein. MOSFET 12 is constituted of a source region 12S, a drain region 12D, and a gate electrode 12G.

A first interlayer insulating film 13 of $SiO_2$ having a thickness of 1000 nm is formed on the silicon substrate 10, covering MOSFET 12. For example, the first interlayer insulating film 13 is formed by CVD using $SiH_4$ and $N_2O$ as source gases. A first adhesive layer 14 of Si containing fluorocarbon having a thickness of 10 nm is formed on the first interlayer insulating film 13. The first adhesive layer 14 is formed by a method same as that of forming the adhesive layer 3 shown in FIG. 1A.

Figure 4B:
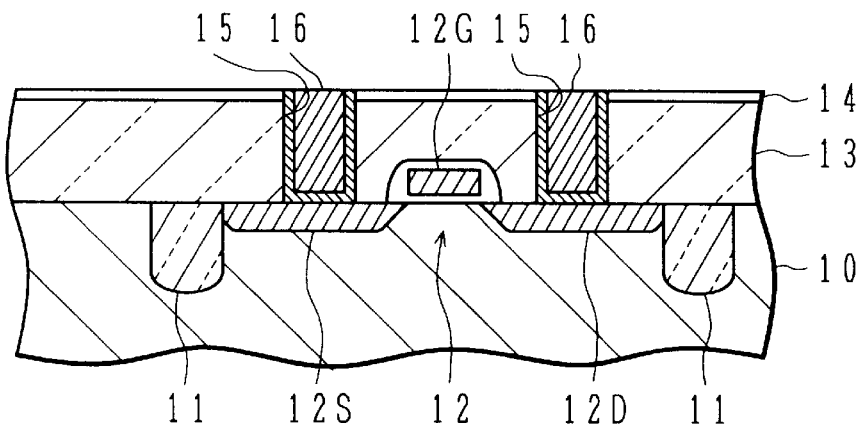

As shown in FIG. 4B, contact holes 15 are formed through the first adhesive layer 14 and interlayer insulating film 13 in areas corresponding to the source region 12S and drain region 12D. The contact holes 15 are formed by covering the surface of the first adhesive layer 14 with a resist pattern and etching the first adhesive layer 14 and interlayer insulating film 13 through RIE using $CF_4$ and $CHF_3$. After the contact holes 15 are formed, the resist pattern is removed.

Conductive plugs 16 are formed burying the insides of the contact holes 15. The conductive plugs 16 are formed by first depositing a TiN film covering the surface of the substrate and the inner walls of the contact holes, then depositing an Al alloy film on the TiN film to fill the insides of the contact holes 15, and finally removing unnecessary TiN film and Al alloy film by CMP.

Figure 4C:
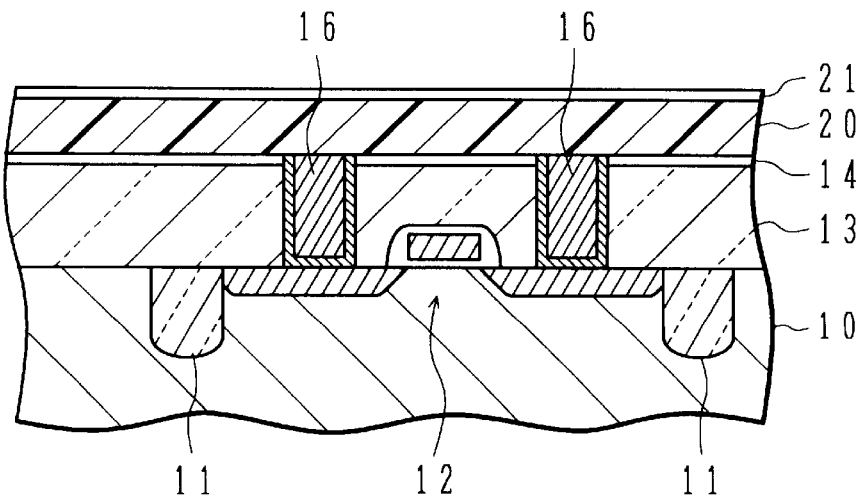

As shown in FIG. 4C, a second insulating film of organic insulating material having a thickness of 500 nm is formed on the first adhesive layer 14. For example, the second interlayer insulating film 20 is made of the material similar to that of the organic insulating film shown in FIG. 1A. A second adhesive layer 21 having a thickness of 10 nm is formed on the second interlayer insulating film 10. The second adhesive layer 21 is formed by the method same as that of forming the first adhesive layer 14.

Figure 5A:
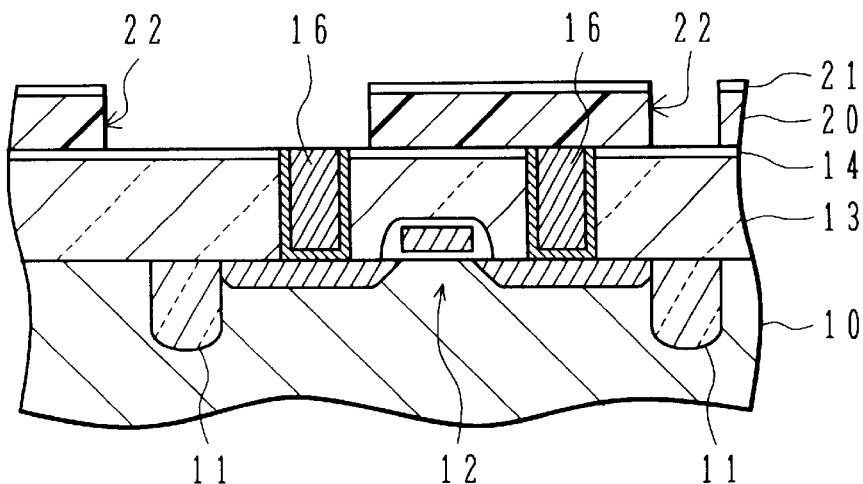

As shown in FIG. 5A, wiring trenches 22 are formed through the second adhesive layer 21 and second interlayer insulating film 20. The wiring trenches 22 are formed by patterning the second adhesive layer 21 and etching the second interlayer insulating film 20 by using the patterned second adhesive layer 21 as a mask. The second adhesive layer 21 is patterned through RIE using $CF_4$ and $CHF_3$. The second interlayer insulating film 20 is etched through RIE using $O_2$.

Figure 5B:
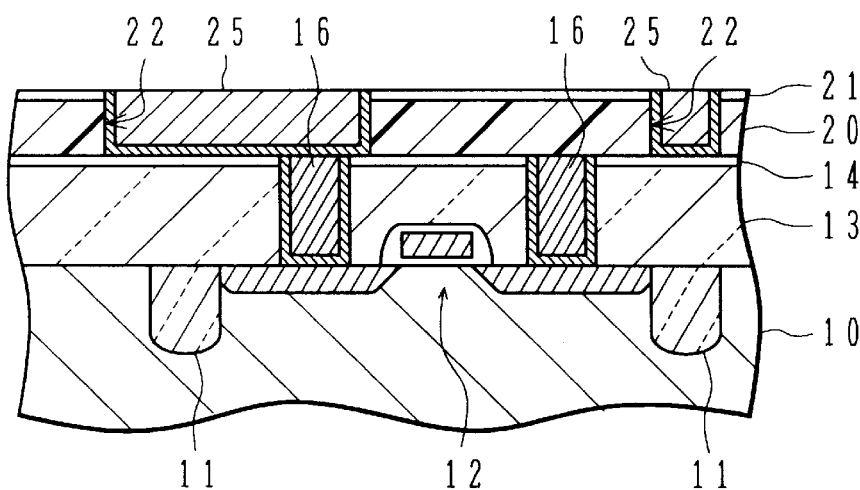

As shown in FIG. 5B, a wiring pattern 25 is formed burying the insides of the wiring trenches 22. The wiring pattern 25 is formed by first depositing a TiN film covering the inner surfaces of the wiring trenches 22 and the upper surface of the adhesive layer 21, then depositing an Al alloy film on the TiN film to completely fill the insides of the contact holes 15 with the Al alloy film, and finally removing unnecessary TiN film and Al alloy film by CMP.

Figure 5C:
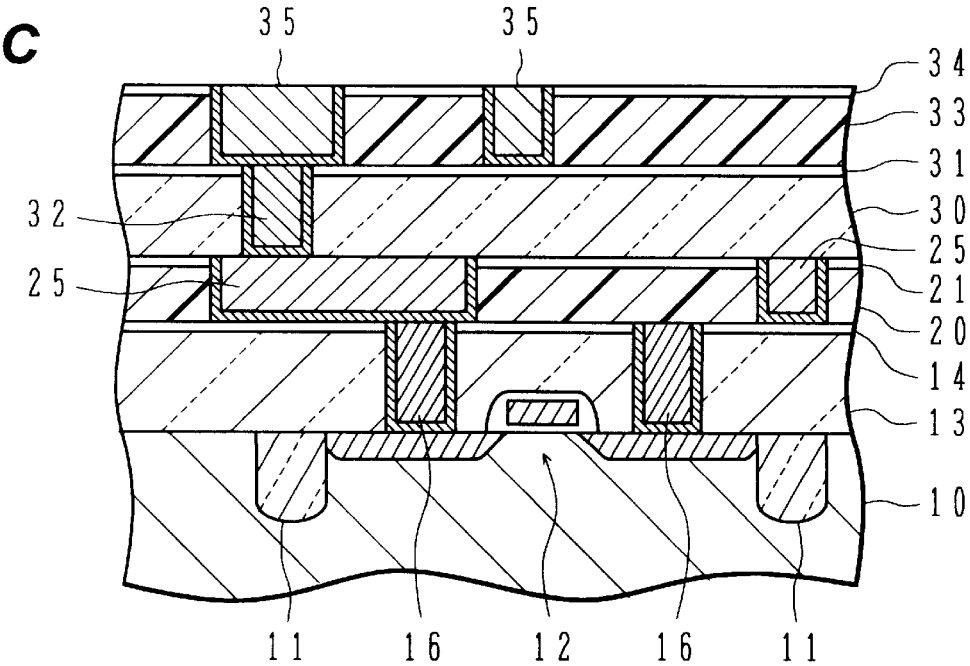

As shown in FIG. 5C, a third insulating film 30 and a third adhesive layer 31 are formed on the second adhesive layer 21. A contact hole is formed through the third adhesive layer 31 and third insulating film 30 and a conductive plug 32 is buried in the contact hole. A fourth interlayer insulating film 33 and a fourth adhesive layer 34 are formed on the third adhesive layer 31. Wiring trenches are formed through the fourth adhesive layer 34 and fourth interlayer insulating film 33, and a wiring pattern 35 is formed burying the insides of the wiring trenches. The wiring structure from the third interlayer insulating film 30 to the fourth adhesive layer 34 is formed by a method similar to that of forming the wiring structure from the first interlayer insulating film 13 to the second adhesive layer 21.

Since the first adhesive layer 14 is inserted between the first interlayer insulating film 13 made of $SiO_2$ and the second interlayer insulating film 20 made of organic insulating material, tight contactness of the second interlayer insulating film 20 to the surface of the underlying layer can be improved. Similarly, tight contactness of each of the interlayer insulating films above the second interlayer insulating film 20 to the surface of each underlying layer can be improved.

The layers in which the wiring patterns 25 and 35 are disposed are made of organic material. The dielectric constant of these layers can be lowered by using the organic insulating materials described with the first embodiment. Since the parasitic capacitance between lines of the wiring pattern can be made small, a signal transmission delay time can be shortened. Similar to the second and fourth interlayer insulating films, the third interlayer insulating film 30 may be made of organic insulating material.

In the second embodiment, each adhesive layer is also used as an etching mask for etching the underlying interlayer insulating film. While the interlayer insulating film is etched through RIE using $O_2$, the resist pattern on the adhesive layer is ashed and removed.

Next, the third embodiment will be described with reference to FIG. 6. In the second embodiment shown in FIGS. 4A to 5C, the multi-layer wiring structure formed by a Damascene method has been described. In the third embodiment, the wiring structure of the first embodiment shown in FIG. 1A is applied to a multi-layer wiring structure formed by a dual Damascene method. With a Damascene method, after the conductive plug 16 shown in FIG. 5C is formed, the wiring pattern 25 is formed on the conductive plug. With a dual Damascene method, the conductive plug 16 and wiring pattern 25 are formed at the same time.

Figure 6:
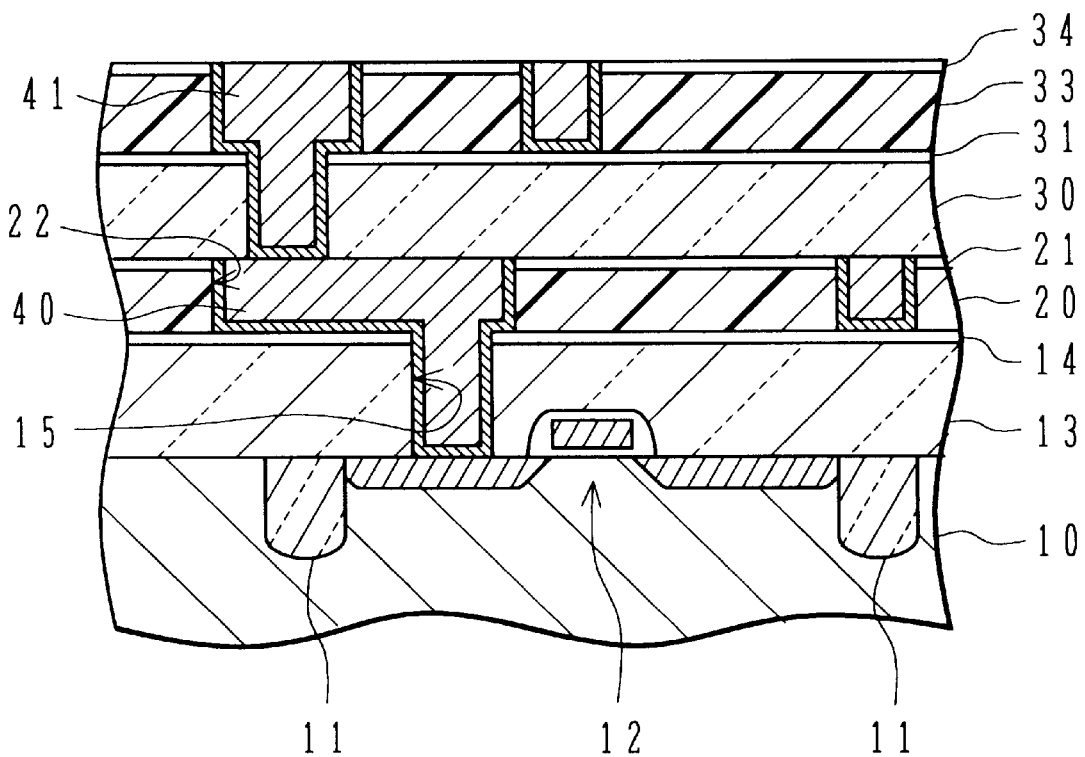
FIG. 6 is a cross sectional view of a wiring structure according to a third embodiment of the invention.

FIG. 6 is a cross sectional view of a multi-layer wiring structure according to the third embodiment. The lamination structure of first to fourth interlayer insulating films 13, 20, 30, 33 and the lamination structure of first to fourth adhesive layers 14, 21, 31, 34 are the same as those shown in FIG. 5C. The first interlayer insulating film 13 and first adhesive layer 14 have a contact hole 15 formed therethrough, and the second interlayer insulating film 20 and second adhesive layer 21 have wiring trenches 22 formed therethrough. The TiN film covers the inner surfaces of the contact hole 15 and wiring trenches 22. The TiN film has a wiring layer formed thereon and burying the insides of the contact hole 15 and wiring trenches 22.

The lamination structure from the third interlayer insulating film 30 to the fourth adhesive layer 34 has a wiring pattern 41 formed therein, the wiring pattern 41 having the structure similar to the wiring pattern 40.

Next, a method of forming the wiring pattern 40 will be described. On the surface of the silicon substrate 10, the first interlayer insulating film 13 and second adhesive layer 21 are laminated. By using a resist pattern having an opening for the contact hole 15 as a mask, the second adhesive layer 21 and first interlayer insulating film 13 are etched.

The resist pattern for the contact hole 15 is removed. By using a resist pattern having openings for the wiring trenches 22, the second adhesive layer 21 and second interlayer insulating film 20 are etched to form the wiring trenches. After the wiring trenches 22 are formed, the resist pattern is removed.

The inner surfaces of the contact hole 15 and wiring trenches 22 and the upper surface of the second adhesive layer 21 are covered with a TiN film. An Al alloy film is deposited on the TiN film, burying the insides of the contact hole 15 and wiring trenches 22. Unnecessary Al alloy and TiN films are removed by CMP to leave the wiring layer in the contact hole 15 and wiring trenches 22.

Also in the structure shown in FIG. 6, the adhesive layer is formed between the interlayer insulating film made of inorganic material and the interlayer insulating film made of organic material. It is therefore possible to improve the tight contactness between each interlayer insulating film and the underlying layer surface.

The present invention has been described in connection with the preferred embodiments. The invention is not limited only to the above embodiments. It is apparent that various modifications, improvements, combinations, and the like can be made by those skilled in the art.

What is claimed is:

1. A lamination structure comprising:

a substrate having a principal surface;

a first layer disposed on the principal surface;

an adhesive layer disposed on said first layer, said adhesive layer being made of SiCF; and a second layer disposed on said adhesive layer, wherein one of said first and second layers is made of a material selected from a group consisting of a material whose main component is Si containing inorganic material, a metal, and an inorganic metal compound, and another is made of an organic insulating film.

2. A lamination structure according to claim 1, wherein the one of said first and second layers is made of $SiO_2$.

3. A lamination structure according to claim 1, wherein a dielectric constant of said adhesive layer is 3.0 or higher.

4. A lamination structure according to claim 1, wherein a density distribution of Si in said adhesive layer has a lower density near the organic insulating film.

5. A lamination structure according to claim 1, wherein said substrate has a conductive region formed in a partial area of the principal surface, said first layer consists of insulating material, said second layer consists of organic insulating material, the lamination structure further comprising:
a contact hole formed through said adhesive layer and said first layer, said contact hole having as a bottom at least a partial area of the conductive region;
a wiring trench formed through said second layer and partially overlapping said contact hole; and
a wiring pattern completely burying said contact hole and said wiring trench and connected to the conductive region.

6. A lamination structure according to claim 5, further comprising:

an upper adhesive layer made of SiCF and covering an upper surface of said second layer not formed with said wiring trench; and a third layer consisting of insulating material formed on said upper adhesive layer.

7. A semiconductor device comprising:

a substrate having a principal surface;

a first layer disposed on the principal surface;

an adhesive layer disposed on said first layer, said adhesive layer being made of SiCF; and a second layer disposed on said adhesive layer, wherein one of said first and second layers is made of a material selected from a group consisting of a material whose main component is Si containing inorganic material, a metal, and an inorganic metal compound, and another is made of an organic insulating film.

8. A semiconductor device according to claim 7, wherein said substrate has a conductive region formed in a partial area of the principal surface, said first layer consists of insulating material, said second layer consists of organic insulating material, the lamination structure further comprising:
a contact hole formed through said adhesive layer and said first layer, said contact hole having as a bottom at least a partial area of the conductive region;

a wiring trench formed through said second layer and partially overlapping said contact hole; and a wiring pattern completely burying said contact hole and said wiring trench and connected to the conductive region.

9. A semiconductor device according to claim 8, further comprising:

an upper adhesive layer made of SiCF and covering an upper surface of said second layer not formed with said wiring trench; and a third layer consisting of insulating material formed on said upper adhesive layer.

10. A lamination structure comprising:

a substrate having a principal surface;

a first layer disposed on the principal surface;

an adhesive layer disposed on said first layer, said adhesive layer being made of SiCF; and a second layer disposed on said adhesive layer, wherein one of said first and second layers is made of a metal or an inorganic metal compound, and another is made of an organic insulating film.

* * * * *